(12) United States Patent
Cory

(10) Patent No.: US 8,411,703 B1
(45) Date of Patent: Apr. 2, 2013

(54) METHOD AND APPARATUS FOR A REDUCED LANE-LANE SKEW, LOW-LATENCY TRANSMISSION SYSTEM

(75) Inventor: Warren E. Cory, Redwood City, CA (US)

(73) Assignee: Xilinx, Inc., San Jose, CA (US)

( * ) Notice: Subject to any disclaimer, the term of this patent is extended or adjusted under 35 U.S.C. 154(b) by 751 days.

(21) Appl. No.: 12/512,583

(22) Filed: Jul. 30, 2009

(51) Int. Cl.
*H04J 3/06* (2006.01)

(52) U.S. Cl. .......... 370/503; 326/93; 327/100; 327/237; 327/386; 713/400; 713/503

(58) Field of Classification Search ................... None
See application file for complete search history.

(56) References Cited

U.S. PATENT DOCUMENTS 7,346,794 B1 * 3/2008 Davidson et al. ............ 713/400

2002/0009169 A1 * 1/2002 Watanabe ..................... 375/371

* cited by examiner

*Primary Examiner* — Phirin Sam
*Assistant Examiner* — Nicholas Sloms
(74) *Attorney, Agent, or Firm* — Michael T. Wallace; Gerald Chan; Lois D. Cartier

(57) ABSTRACT

A method and apparatus for a multiple lane transmission system that provides a fixed, low-latency mode of operation with reduced lane-lane skew while process, voltage, and temperature (PVT) variation, as well as other sources of variation, occur over time. Multiplexing techniques are utilized within each transmission lane to allow programmably adaptive use of phase alignment circuitry for various modes of operation. As a result, power consumption and semiconductor die area are reduced because multiple copies of phase alignment circuitry within each transmission lane are not required. Also, injection of additional jitter on the serial outputs due to continuous operation of phase alignment circuitry is prevented. Rather, multiplexers within the phase alignment circuitry selectively adapt the timing architecture to that required by the selected mode of operation.

7 Claims, 4 Drawing Sheets

METHOD AND APPARATUS FOR A REDUCED LANE-LANE SKEW, LOW-LATENCY TRANSMISSION SYSTEM

FIELD OF THE INVENTION

The present invention generally relates to gigabit serial transmitters, and more particularly to reduced lane-lane skew in multiple lane transmission systems, reduction of latency, and/or precise determination of latency.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, support for other communication attributes, such as reduced lane-lane skew for multiple lane communication systems and modes of operation with low or precisely known latency, remain important as well. As an example, the PCI-Express (PCIe) standard specifies that the lane-lane skew for a multiple lane transmission system is not to exceed approximately 2 unit intervals (UI), i.e., 2 bit periods, across any of the transmission lanes.

In programmable logic device (PLD) implementations of multiple lane transmission systems, data is provided to multiple transmission lanes by the core, i.e., fabric, of the PLD. The fabric of the PLD also provides a fabric clock signal that is utilized to propagate the fabric data through the physical coding sublayer (PCS) of each transmission lane. The physical medium attachment (PMA) layer receives the fabric data from the PCS, serializes the fabric data, and then transmits the serialized fabric data to the receiving end of the transmission lane.

Since the clock signal used to clock fabric data into the serializer of the PMA is not necessarily phase aligned with the fabric clock signal that is used to clock fabric data through the PCS, a first-in, first-out (FIFO) is generally utilized to provide "elasticity" between each PCS/PMA pair. In particular, while the PCS clocks fabric data into the FIFO using the fabric clock signal, the fabric data is non-coherently clocked out of the FIFO into the PMA's serializer. As a result, the FIFO facilitates dependable data transfer between the PCS/PMA pair despite the lack of timing coherency between each PCS/PMA pair, since the memory depth of the FIFO is generally effective to absorb the timing discrepancies that may exist between the PCS/PMA pair.

Latency is added into the transmission lane, however, when "elastic" components such as a FIFO are used to insure dependable PCS/PMA data transfer. The amount of added latency, however, is not precisely known. Elastic components, therefore, cannot be utilized when certain I/O standards, such as the Common Public Radio Interface (CPRI) standard, are implemented within the PLD, since the resulting latency of the transmission data path cannot be maintained or determined within specification.

Alternate PCS/PMA phase alignment techniques are, therefore, required, since in the absence of an elastic component, phase coherency between the PCS/PMA pair is not otherwise ensured for dependable data transfer. Conventionally, a phase aligner is utilized, whereby the fabric clock signal that is used to write fabric data into the PCS data register is phase aligned with the PMA clock signal that is utilized to transfer data from the PCS data register to the serializer of the PMA. Such methods to ensure phase coherency between the PCS/PMA pair have, therefore, simply removed the elastic components from each transmission lane.

As previously noted, another requirement of certain I/O standards is that lane-lane skew across multiple transmission lanes be maintained within specification, for example, not exceeding approximately 2 UI for the PCIe standard. In order to minimize lane-lane skew across multiple transmission lanes, a global clock tree is utilized, whereby leaf nodes of the global clock tree provide the fabric clock signal to each PCS. The clock tree is balanced, so that the fabric clock signals provided by each leaf node to each PCS may be substantially aligned to one another. By utilizing a phase aligner in each transmission lane, the respective PCS/PMA pairs may be made to be coherent with one another, while the global clock tree is utilized to minimize lane-lane skew across the multiple transmission lanes.

With conventional techniques for low latency modes of operation without a FIFO, however, failure modes may be caused to exist within the serial transmitter(s) when process, voltage, and temperature (PVT) and/or other modes of variation occur over time. In particular, while phase coherency between a PCS/PMA pair may be achieved at one PVT corner with appropriate phase alignment settings, phase coherency may be lost at another PVT corner due to non-uniform, PVT induced variation in clock phases between the PCS/PMA pair.

Stated differently, PVT variation over time may cause non-uniform changes in the substantial global clock tree that provides the fabric clock signal to each PCS, as compared with the smaller, localized clock generation and distribution within the PCS/PMA pair. As a result, previously calibrated phase coherency may fall outside of specified performance limits or reliable operating tolerance due to PVT variation over time.

While continuous operation of the phase aligner within each transmission lane would achieve PCS/PMA coherency with minimized lane-lane skew across all PVT corners, conventional placement of the phase aligner within each transmission lane contemporaneously increases induced phase jitter beyond acceptable limits. Alternate placement of the phase aligner is effective to reduce phase jitter to within acceptable limits, but does not otherwise provide a viable multiple lane transmission architecture due to the inability to adequately control lane-lane skew.

Through duplication of phase alignment circuitry, therefore, PCS/PMA coherency with minimized lane-lane skew across all PVT corners may be achieved, while contemporaneously maintaining phase jitter to within acceptable limits. Such an implementation, however, disadvantageously increases required circuitry, which results in increased power consumption and increased semiconductor die area usage.

Efforts continue, therefore, to solve the lane-lane synchronization challenge of low latency, multiple transmission communication systems without increasing phase jitter, power consumption, or semiconductor die area usage.

SUMMARY

To overcome limitations in the prior art, and to overcome other limitations that will become apparent upon reading and understanding the present specification, various embodiments of the present invention disclose an apparatus and method that reduces lane-lane skew in multiple lane transmission systems while minimizing phase jitter, power consumption, and semiconductor die area usage.

In accordance with one embodiment of the invention, a method of establishing a multiple-lane transmission system comprises: selecting a first transmission lane as a reference transmission lane, and establishing data transfer through the reference transmission lane using phase aligned first and second clock signals. The method further comprises exporting a third clock signal from the reference transmission lane as a reference clock signal to remaining transmission lanes of the transmission system. The method further comprises establishing data transfer through the remaining transmission lanes by phase aligning respective fourth and fifth clock signals of the remaining transmission lanes to the third clock signal. The method further comprises deactivating phase alignment within the remaining transmission lanes, and maintaining phase alignment within the reference transmission lane to maintain phase alignment within the remaining transmission lanes.

In this embodiment, establishing data transfer through the reference transmission lane can comprise: clocking data into a register of a physical coding sublayer of the reference transmission lane using the first clock signal; and clocking the data from the register into a serializer of a physical medium attachment of the reference transmission lane using the second clock signal. The establishing data transfer through the reference transmission lane can further comprise deriving the first clock signal from the reference clock signal. The establishing data transfer through the reference transmission lane can further comprise adjusting a phase of the third clock signal to obtain substantial phase coherency between the second and reference clock signals. The exporting a third clock signal can comprise: providing the third clock signal to a global clock tree via a first delay block; and distributing the third clock signal from the global clock tree to the reference transmission lane and the remaining transmission lanes via respective delay blocks of each leaf node of the global clock tree.

In this embodiment, the establishing data transfer through the remaining transmission lanes can comprise: clocking data into a register of a physical coding sublayer of each remaining transmission lane using the fourth clock signal; and clocking the data from the register into a serializer of a physical medium attachment of each remaining transmission lane using the fifth clock signal. The establishing data transfer through the remaining transmission lanes can further comprise deriving the fourth clock signal from the reference clock signal within each of the remaining transmission lanes. The establishing data transfer through the remaining transmission lanes can further comprise adjusting a phase of the fifth clock signal to obtain substantial phase coherency between the fifth and reference clock signals.

In accordance with another embodiment of the invention, a transmission system comprises a transmission lane that is configured to receive parallel data using a first clock signal and to serialize the parallel data using a second clock signal. The transmission lane includes a clock generator that is configured to select between phase aligned and non-phase-aligned clock signals as the first and second clock signals. The clock generator includes a first multiplexer to programmably select between a phase aligned and a non-phase aligned bit clock signal as the first and second clock signals. The clock generator further includes a second multiplexer to programmably select between a phase aligned and a non-phase aligned byte clock signal as a clock signal exported from the clock generator. The transmission system further comprises a global clock tree that is coupled to receive the exported clock signal and is configured to provide the exported clock signal to the clock generator as a reference clock signal.

In this embodiment, the phase-locked loop can be coupled to the clock generator and configured to provide the non-phase aligned bit clock signal. The clock generator can further comprise a first divider coupled to an output of the first multiplexer and configured to divide the second clock signal to generate the first clock signal. The clock generator can further comprise a second divider coupled to a first input of the second multiplexer and configured to divide the phase aligned bit clock signal, where the second multiplexer selects between the divided phase aligned bit clock signal and the first clock signal as the exported clock signal. The clock generator can further comprise a phase aligner coupled to receive the first clock signal and the reference clock signal and configured to provide a control signal to substantially align a phase of the first clock signal with a phase of the reference clock signal. The clock generator can further comprise an interpolator coupled to receive the control signal and coupled to receive the non-phase aligned bit clock signal and configured to minimize a phase error between the first clock signal and the reference clock signal in response to the control signal.

In accordance with another embodiment of the invention, a method of establishing a single-lane transmission system comprises selecting a non-phase aligned bit clock signal to generate first and second clock signals. The first clock signal is utilized to transfer parallel data into the transmission lane and the second clock signal is utilized to transfer serial data from the transmission lane. The method further comprises dividing a phase-aligned bit clock signal to generate a byte clock signal and exporting the byte clock signal from the transmission lane to a global clock tree. The method further comprises receiving the byte clock signal from the global clock tree as a reference clock signal and adjusting a phase of the byte clock signal to substantially match a phase of the first clock signal with the reference signal to establish reliable data transfer through the transmission lane.

In this embodiment, the selecting a non-phase aligned bit clock signal can comprise programmably controlling a first multiplexer to provide a phase-locked loop output signal as the first and second clock signals. The exporting the byte clock signal can comprises programmably controlling a second multiplexer to select the byte clock signal. The adjusting a phase of the byte clock signal can comprise comparing a phase of the first clock signal to a phase of the reference clock signal; and generating a control signal in response to the comparison. The adjusting a phase of the byte clock signal can further comprise selecting a phase of the non-phase aligned bit clock signal in response to the control signal; and dividing the selected non-phase aligned bit clock signal to produce the byte clock signal. The adjusting a phase of the byte clock signal can further comprise minimizing a phase difference between the first clock signal and the reference clock signal.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to a multiple lane transmission system that provides both a low latency mode of operation and reduced lane-lane skew across all process, voltage, and temperature (PVT) variation as well as other sources of variation. Multiplexing techniques are utilized within each transmission lane to allow adaptive use of phase alignment circuitry for various modes of operation, including single lane transmission schemes. As a result, power consumption and semiconductor die area are reduced because multiple copies of phase alignment circuitry are not required. Rather, multiplexers selectively adapt the timing scheme to the mode of operation that is desired by reusing a single copy of the phase alignment circuitry in a different manner.

Figure 1:
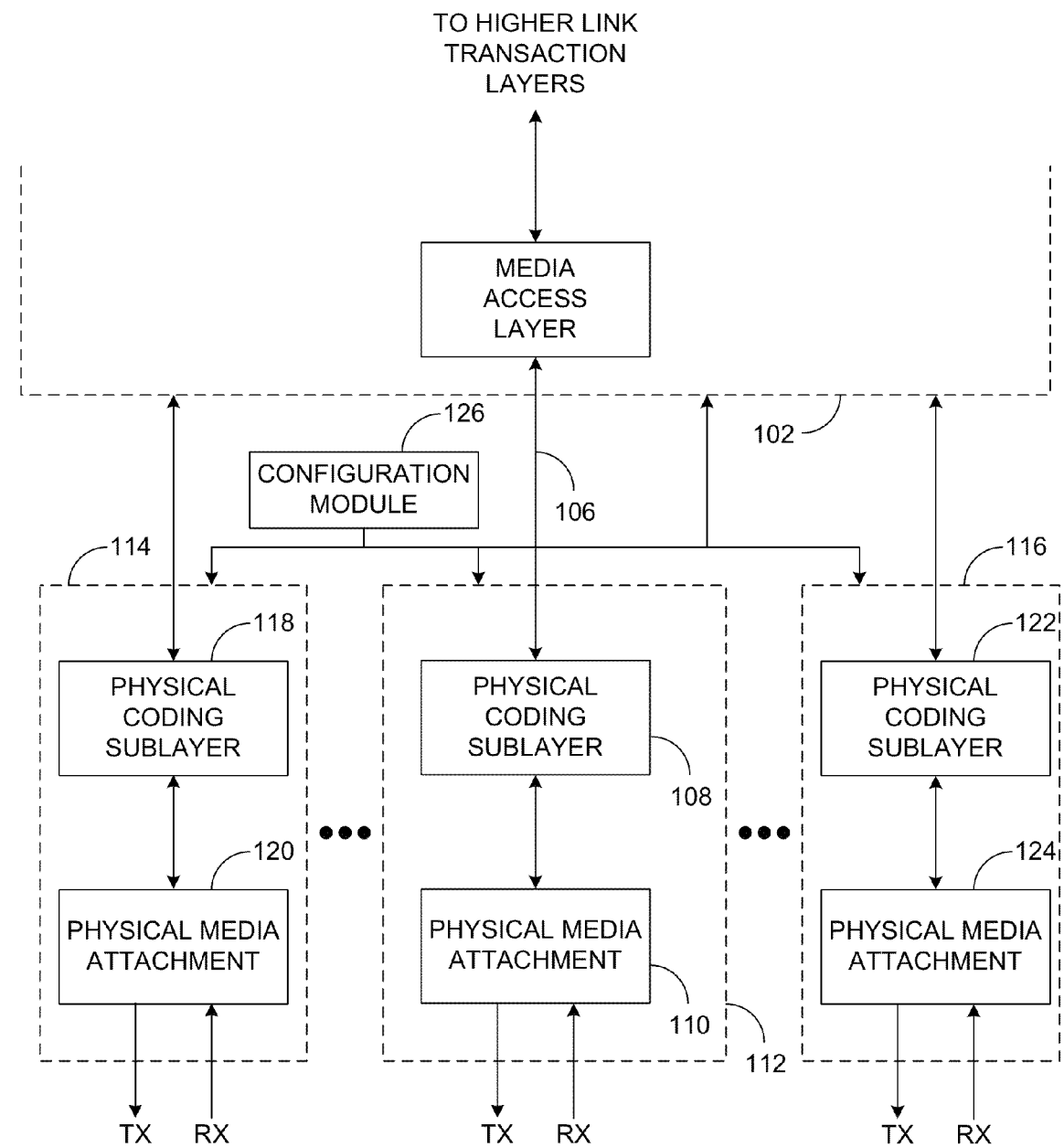
FIG. 1 illustrates exemplary communication stacks for the various PHY layers of a multiple-lane, gigabit transceiver.

Turning to FIG. 1, an exemplary communication stack is illustrated, whereby multiple gigabit transceivers may be configured as a single-lane, or a multiple-lane, transmission system. In one embodiment, PHY layers 112-116 may be implemented within an integrated circuit such as a programmable logic device (PLD) such as, e.g., a field programmable gate array (FPGA). In particular, the associated PMA and PCS layers may reside within a gigabit transceiver of the FPGA, while the media access layer (MAC) and the higher link transaction layers may reside within the programmable logic portion, i.e., programmable fabric and associated processing 102, that also resides within the FPGA.

In one embodiment, PHY layer 112 may represent a PHY interface for a single gigabit transceiver, while PHY layers 114 and 116 of the FPGA may be simultaneously configured for other communication protocols. In an alternate embodiment, all of the TX interfaces of PHY layers 112-116 may be combined to form a multiple channel transmission system that is compliant with I/O standards that require lane-lane skew reduction in a low latency mode of operation.

PMA 110, 120, and 124 provide a serializer/deserializer ("SERDES") function, whereby parallel data received from PCS 108, 118, and 122, respectively, may be serialized prior to transmission via the TX interface. Further, serial data received from the RX interface may be converted to parallel data prior to being delivered to PCS 108, 118, and 122. PMA 110, 120, and 124 may also incorporate a clock and data recovery (CDR) module whereby a clock signal and a data signal is derived from the input signal received at the RX interface. Once derived, the clock signal may be divided to form a parallel clock signal that is used to propagate the parallel data into the FPGA for further processing.

One of PMAs 110, 120, and 124 is considered to be the reference PMA during a transmit mode of operation, whereby the reference PMA generates the BYTE CLOCK signal that is used to drive a root of a global clock tree (not shown) existing within programmable logic fabric 102. Clock signals from the leaf nodes of the global clock tree are fanned out to the remaining "slave" PMAs, whereby the slave PMAs may phase align their respective transmission drivers to the REFERENCE CLOCK signal that is received from their respective global clock tree leaf nodes.

Figure 2:
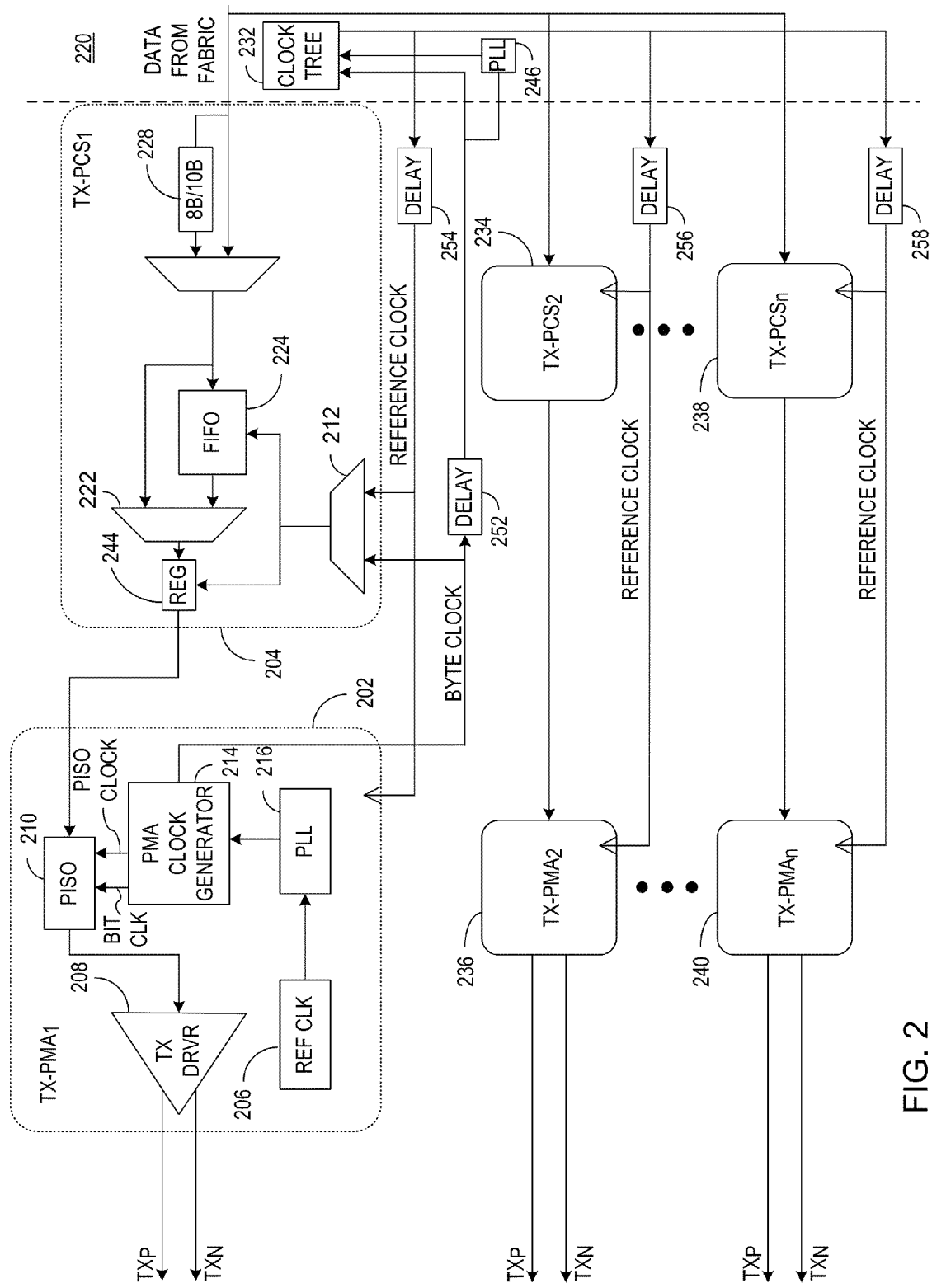
FIG. 2 illustrates a block diagram of a multiple-lane transmission system in accordance with one embodiment of the present invention.

Turning to FIG. 2, an exemplary block diagram of a multiple-lane transmission system is illustrated, whereby transmission PMA (TX-PMA) 202 is illustrated as the reference PMA, while TX-PMAs 236 and 240 are illustrated as the slave PMAs. Reference PMA 202 coherently multiplies the reference clock signal received from REF CLK 206 through the use of PLL 216 to provide the bit clock signal, BIT CLK, to parallel-in, serial-out (PISO) 210 and to provide the PISO CLOCK signal, PISO CLOCK, to PISO 210. In operation, the PISO CLOCK signal transfers fabric data from register 244 into PISO 210, while the BIT CLK signal is utilized to retrieve serial data from PISO 210 to be transmitted via TX driver 208.

Reference PMA 202 transmits the byte clock signal, BYTE CLOCK, to global clock tree 232 for dissemination by the leaf nodes of global clock tree 232 as signal REFERENCE CLOCK. Reference PMA 202 may be programmably tasked with phase aligning the REFERENCE CLOCK signal to the PISO CLOCK signal via PMA clock generator 214, so as to ensure reliable data transfer between PCS 204 and PMA 202.

As discussed in more detail below, each of PMAs 236 and 240 may also be programmably tasked with phase aligning the PISO CLOCK signal to the REFERENCE CLOCK signal (i.e., the converse of the above alignment operation) so as to minimize lane-lane skew across all transmission channels. Single or multiple PMAs may be similarly configured to implement various timing architectures in support of various modes of operation as discussed in more detail below.

Synchronization of one or more lanes of the transmission system of FIG. 2 is performed by first achieving phase/frequency lock to a local reference, e.g., REF CLK 206, and multiplying the local reference up to a bit clock frequency and a byte clock frequency within reference PMA 202. PMA clock generator 214, as discussed in more detail below, is programmably configured to cause the PISO CLOCK signal to become phase aligned with the REFERENCE CLOCK signal that is provided by the leaf nodes of global clock tree 232. The phase alignment occurs by adjusting the phase of either the PISO CLOCK signal or the BYTE CLOCK signal, where adjustment of the phase of the BYTE CLOCK signal adjusts the phase of the REFERENCE CLOCK signal by propagation of the BYTE CLOCK signal through the global clock tree 232.

The BYTE CLOCK signal is provided to the root of global clock tree 232 via delay block 252 with or without multiplication. If the BYTE CLOCK signal is at a lower frequency than desired, then a multiplier, such as PLL 246, may optionally be used to multiply signal BYTE CLOCK to the desired frequency of signal REFERENCE CLOCK. Subsequent distribution of the REFERENCE CLOCK signal from the leaf nodes of global clock tree 232, to TX-PCS 204/234/238 and to TX-PMA 202/236/240 via delay blocks 254-258, respectively, is then performed. Delay blocks 252-258 represent wire and signal buffering delay in the propagation of the BYTE CLOCK signal through the global clock tree 232, as well as local clock distribution within TX-PCS 204/234/238.

As can be seen, multiplexer 222 of TX-PCS 204 is provided to allow bypassing of FIFO 224 when a low latency mode of operation is desired. However, when FIFO 224 is bypassed from the transmission data path, the elastic buffering operation performed by FIFO 224 is also bypassed. In order to maintain reliable data transmission during bypass mode, therefore, the clock signal, REFERENCE CLOCK, used to clock data into register 244 and the clock signal, PISO CLOCK, used to clock data into parallel in/serial out (PISO)

210 of each transmission lane must be in a known phase relationship with respect to one another.

PMA clock generator 214 may, therefore, be activated to insure that such a phase relationship exists. That is to say, in other words, that PMA clock generator 214 causes signals PISO CLOCK and REFERENCE CLOCK within reference PMA 202 to become phase aligned. As a result, reliable data transfer between PCS 204 and PMA 202 may be conducted to transmit serial data from PMA 202.

PVT variations that may occur over time may cause changes in the delays represented by delay blocks 252 and 254, which disturbs the established phase alignment between the REFERENCE CLOCK and the PISO CLOCK signals. To prevent loss of the established phase coherency, the PMA clock generator 214 may operate continuously, correcting for changes in the phase alignment on an ongoing basis.

If the PMA clock generator 214 continuously adjusts the phase of the PISO CLOCK signal, however, additional phase jitter is generated on serial lines TXP and TXN, which will not be acceptable for some communications standards. Thus, continuous operation of PMA clock generator 214 may adjust the phase of the BYTE CLOCK signal, as opposed to adjusting the phase of the PISO CLOCK signal, so as to eliminate the generation of additional phase jitter on serial lines TXP and TXN.

For the operation of a multiple-lane communication system with low lane-lane skew, the global clock tree 232 distributes the REFERENCE CLOCK signal to TX-PCS 204/234/238 and TX-PMA 202/236/240. The respective PMA clock generators 214 for TX-PMA 236 and 240 cannot achieve phase coherency by adjusting the phase of the REFERENCE CLOCK signal, which is controlled by PMA clock generator 214 of TX-PMA 202.

However, PMA clock generators 214 for TX-PMA 236 and 240 may be configured to adjust the phase of their respective PISO CLOCK signals instead. If phase coherency is established simultaneously in TX-PMA 202/236/240, and if the wire and buffering delays represented by delay blocks 254/256/258 are substantially similar, then by transitivity, the TXP and TXN serial lines from TX-PMA 202/236/240 will be substantially aligned.

To prevent additional jitter on serial lines TXP and TXN of TX-PMA 236 and 240, the PMA clock generators 214 for TX-PMA 236 and 240 may be deactivated once alignment of the serial TXP and TXN lines is established. The serial lines remain aligned, provided the PLL operation is identical between the TX-PMA 202/236/240, which is conventionally accomplished by: 1) sharing the same PLL 216 between all the lanes; 2) sharing the same REF CLK 206 between all the lanes; or 3) some combination of sharing PLL and REF CLK signals.

As noted above, PMA clock generator 214 in TX-PMA 202 operates continuously to provide continuous adjustments for PVT or other variations over time. If the impact of such variations is substantially similar in the delays represented by delay blocks 254-258, as well as in other affected logic that appears in all the lanes, then the variations in the PISO CLOCK and REFERENCE CLOCK signals should be similar in all the lanes, such that maintenance of phase coherency between PCS/PMA pair 204 and 202 results in continued phase coherency for PCS/PMA pairs 234/236 and 238/240.

Figure 3:
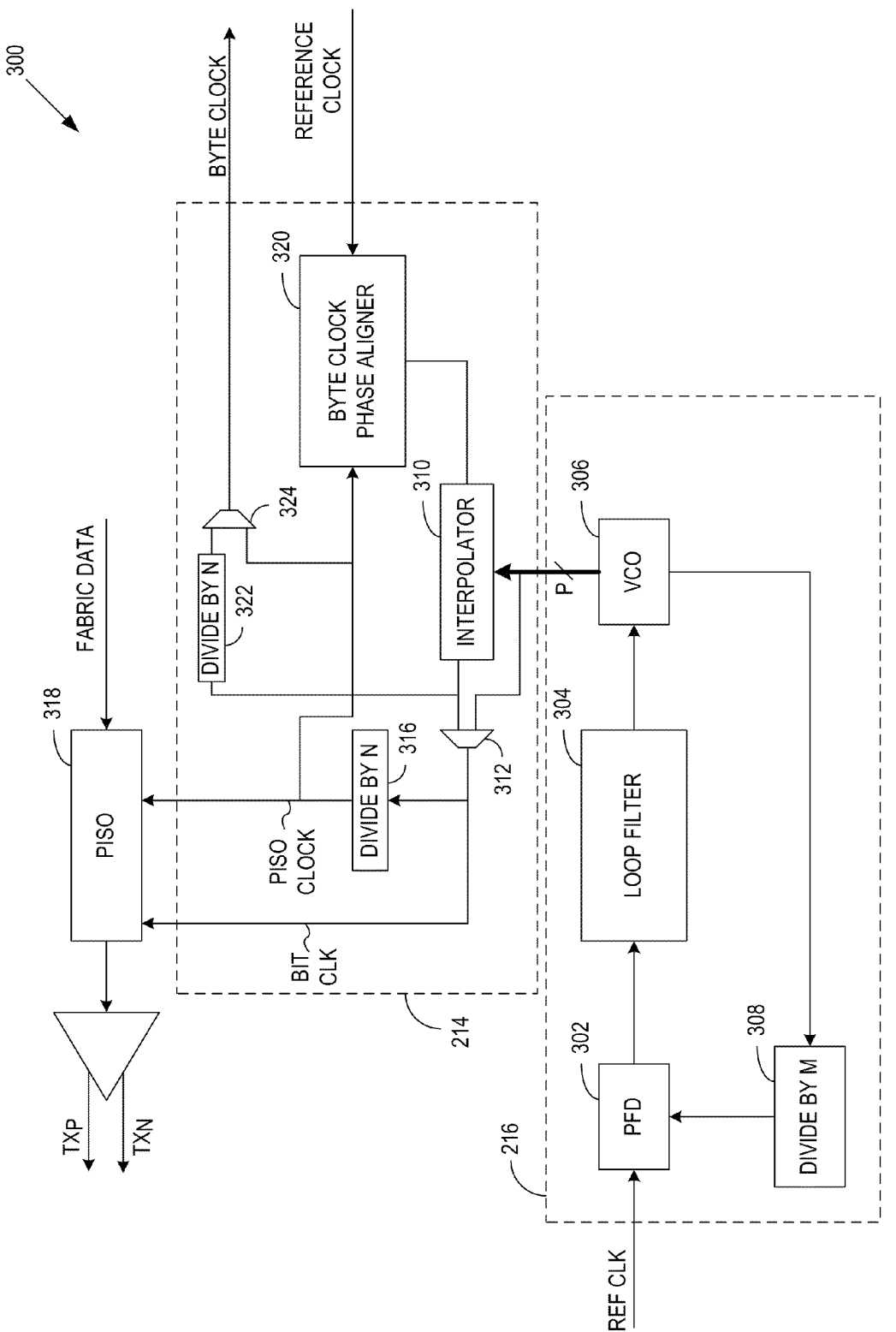
FIG. 3 illustrates a block diagram of the timing architecture of each transmitter of FIG. 2 in accordance with one embodiment of the present invention.

Turning to FIG. 3, a block diagram of the TX-PMA blocks 202/236/240 of FIG. 2, with details of PMA clock generator 214, is illustrated in accordance with one embodiment of the present invention. In operation, PLL 216 seeks to maintain a coherent phase relationship between signal REF CLK and the bit clock that is provided by voltage controlled oscillator (VCO) 306. In so doing, PLL 216 includes phase frequency detector (PFD) 302 to compare the phase/frequency of signal REF CLK to a divided version of the phase/frequency of VCO 306, $f_{VCO}/M$, as provided by divide-by-M 308.

Any phase and/or frequency error that is detected between signal REF CLK and $f_{VCO}/M$ by PFD 302 is converted into an error signal and subsequently provided to loop filter 304. Loop filter 304 integrates the phase and/or frequency error to generate an error voltage, which is then provided to VCO 306. In response, VCO 306 adjusts its output frequency, $f_{VCO}$, such that the phase/frequency error between signal REF CLK and signal $f_{VCO}$ is minimized. VCO 306 provides several phase variants of signal $f_{VCO}$, whereby a first variant is signal $f_{VCO}$ itself, a second variant exhibits a phase offset of 1*(360/P) degrees from signal $f_{VCO}$, a third variant exhibits a phase offset of 2*(360/P) degrees from signal $f_{VCO}$ and so on.

PMA clock generator 214 is configured with selective multiplexing, so that PMA clock generator 214 may be utilized in various modes of operation depending upon the configuration of the one or more transmission lanes of FIG. 2. In a first mode of operation, signal PISO CLOCK is derived from a phase adjusted source, i.e., from interpolator 310, whereby signal PISO CLOCK is made to be phase coherent with signal REFERENCE CLOCK. In a second mode of operation, signal BYTE CLOCK is derived from a phase adjusted source, i.e., from interpolator 310, whereby signal REFERENCE CLOCK is made to be phase coherent with signal PISO CLOCK.

For the second mode of operation, signal PISO CLOCK is derived from a non-phase adjusted source, i.e., from PLL 216. Moreover, signal REFERENCE CLOCK is assumed to be derived from signal BYTE CLOCK by propagation through a global clock tree as in FIG. 2, so that the adjustments to signal BYTE CLOCK by interpolator 310 effects the necessary adjustments to signal REFERENCE CLOCK.

In other embodiments, signals PISO CLOCK and BYTE CLOCK may be derived from a non-phase adjusted source, i.e., from PLL 216 that is not phase coherent with signal REFERENCE CLOCK. It is appreciated, therefore, that PMA clock generator 214 is configured with only a single instance of byte clock phase aligner 320 and interpolator 310 along with selective multiplexing, so as to support the various usages of each transmission lane of FIG. 2 as required.

In a standard mode of operation, FIFO 224 is not bypassed and the output of each transmission lane is not aligned to the output of any other transmission lane. As a result, multiplexer 312 is configured by configuration module 126 of FIG. 1 to select a single output from VCO 306. In addition, multiplexer 324 is configured to select the PISO CLOCK signal from divide-by-N 316.

As a result, interpolator 310 is bypassed and does not phase align signal PISO CLOCK and signal REFERENCE CLOCK. However, since FIFO 224 is not bypassed, FIFO 224 "absorbs" the phase difference between signals PISO CLOCK and REFERENCE CLOCK, such that reliable data transfer between PCS 204 and PMA 202 is nevertheless ensured. Signal BYTE CLOCK (as distinguished from signal REFERENCE CLOCK from the global clock tree 232) is substantially aligned with signal PISO CLOCK and is selected by multiplexer 212 to operate register 244 directly along with the read address for FIFO 224. The locality of signal BYTE CLOCK within the PCS/PMA pair, which is not subject to large and unknown delays through the global clock tree 232, allows for reliable transfer of the fabric data from TX-PCS to TX-PMA without use of BYTE CLOCK PHASE ALIGNER 320.

For a low-latency, single-lane transmission mode, on the other hand, FIFO 224 is bypassed. Multiplexer 312 is configured by configuration module 126 of FIG. 1 to select a single output from VCO 306, while multiplexer 324 is alternately configured to select the interpolated signal from divide-by-N 322. Signal REFERENCE CLOCK is derived from signal BYTE CLOCK via a clock network, e.g., global clock tree 232, that is suitable for coherent operation of fabric 220 and TX-PCS logic. As a result, interpolator 310 interoperates with byte clock phase aligner 320 to cause signals PISO CLOCK and REFERENCE CLOCK to become phase aligned by suitable adjustments to the phase of signal BYTE CLOCK.

In accordance with the multiplexer configuration for a low-latency, single-lane transmission mode, signal BIT CLK is derived directly from VCO 306 and divide-by-N 316 converts signal BIT CLK into signal PISO CLOCK by dividing signal BIT CLK by an integer value, N. Signal BIT CLK is utilized by PISO 318 to transmit differential serial data signals, $TX_P$ and $TX_N$, while signal PISO CLOCK is utilized to clock signal FABRIC DATA into PISO 318 from data register 244 of FIG. 2. Divide-by-N 322 similarly converts the output of interpolator 310 through division by an integer value, N.

The PISO CLOCK signal is also provided to byte clock phase aligner 320 for comparison with signal REFERENCE CLOCK. Byte clock phase aligner 320 then causes interpolator 310 to interpolate between two of the P phase variants provided by VCO 306 until the phase error between signals PISO CLOCK and REFERENCE CLOCK is minimized. Reliable data transfer between PCS 204 and PMA 202 is, therefore, ensured during a low-latency, single-lane transmission mode because the signal that clocks data into register 244, i.e., signal REFERENCE CLOCK, is phase coherent with the signal that clocks data into PISO 210, i.e., signal PISO CLOCK.

Since signals BIT CLK and PISO CLK as provided to PISO 318 are not generated by interpolator 310, the byte clock phase aligner 320 may operate continuously without adding jitter to the serial lines TXP and TXN. As a result, process, temperature, or voltage (PVT) variation, or any other source of variation, that causes the delay magnitude exhibited by delay blocks 252-254 to change may be accommodated. Thus, signals PISO CLOCK and REFERENCE CLOCK remain phase coherent to ensure reliable data transfer between PCS/PMA pair 204 and 202 of FIG. 2 even when significant PVT variation is present.

For a low-latency, multiple-lane transmission mode, FIFO 224 is bypassed for each transmission channel of FIG. 2. One of PMAs 202, 236, or 240, acts as a reference PMA to provide signal BYTE CLOCK to global clock tree 232. Thus in one embodiment, reference PMA, e.g., PMA 202, supplies signal BYTE CLOCK to global clock tree 232, where signal REFERENCE CLOCK is disseminated to the remaining transmission channels by the leaf nodes of global clock tree 232.

In such an instance, PMA clock generator 214 of reference PMA, e.g., PMA 202, is configured differently as compared to the remaining PMA clock generators 214 of PMAs 236 and 240. In PMA 202 for example, multiplexer 312 is configured by configuration module 126 of FIG. 1 to select a single output from VCO 306. Multiplexer 324 is alternately configured to select the interpolated signal from divide-by-N 322. As a result, interpolator 310 interoperates with byte clock phase aligner 320 to cause signals PISO CLOCK and REFERENCE CLOCK to become phase aligned within PMA 202 as discussed above for the low-latency, single-lane mode.

For the remaining PMAs 236 and 240, multiplexer 312 is instead configured to select the interpolated output from interpolator 310 and the configuration of multiplexer 324 is a don't care, since signal BYTE CLOCK from the remaining PMAs 236 and 240 is unused. As a result, interpolator 310 interoperates with byte clock phase aligner 320 to cause signals PISO CLOCK and REFERENCE CLOCK to become phase aligned by suitable adjustments to the phase of signal PISO CLOCK. Since such adjustments cause additional jitter in the serial lines TXP and TXN, it is desired that the phase adjustments in PMAs 236 and 240 occur for some initial period only, and not on a continuing basis.

Initialization of the low-latency, multiple-lane transmission mode begins by activating byte clock phase aligner 320 of the reference PMA, e.g., PMA 202, while the remaining byte clock phase aligners are deactivated. After an initialization period for PMA 202, signal REFERENCE CLOCK becomes phase aligned with signal PISO CLOCK of PMA 202 so as to ensure reliable data transfer between PCS 204 and PMA 202 to TX driver 208 as discussed above.

It is noted that the operation of interpolator 310 and byte clock phase aligner 320 is such that the interpolator 310 may continuously vary the phase selection within some narrow region when phase locked, which injects some amount of phase jitter onto signal BYTE CLOCK. Thus, after the initialization period for PMA 202, PMA clock generator 214 of PMA 202 is temporarily deactivated after the initialization for PMA 202, so as to reduce the amount of phase jitter that is supplied to the remaining PMAs 236 and 240 via signal REFERENCE CLOCK.

During the initialization periods for the remaining PMAs 236 and 240, the respective byte clock phase aligners 320 are activated, so that the respective PISO CLOCK signals may become phase aligned to their respective REFERENCE CLOCK signals as discussed above. Once the initialization period for each PMA is complete, the transmission clocks across all transmission lanes are reasonably matched. That is to say, in other words, that by transitive relation between each PMA clock generator 214 of each PMA, each PISO CLOCK signal of each respective PMA is substantially aligned with each other, such that the lane-lane skew across all transmission lanes is within acceptable limits as specified by the I/O standard being implemented.

After the initialization period for each PMA is complete, the phase align blocks of all but the reference PMA are deactivated because once the PISO CLOCK signals of each transmission lane are aligned, the PISO CLOCK signals tend to stay aligned even during PVT variation. The phase aligner of the reference PMA, e.g., PMA 202, however, remains active so as to adjust the phase alignment of signal REFERENCE CLOCK with respect to the PISO CLOCK signals of all other PMAs even if the magnitude of the delay provided by delay blocks 252-258 changes significantly due to PVT or other sources of variation.

Figure 4:
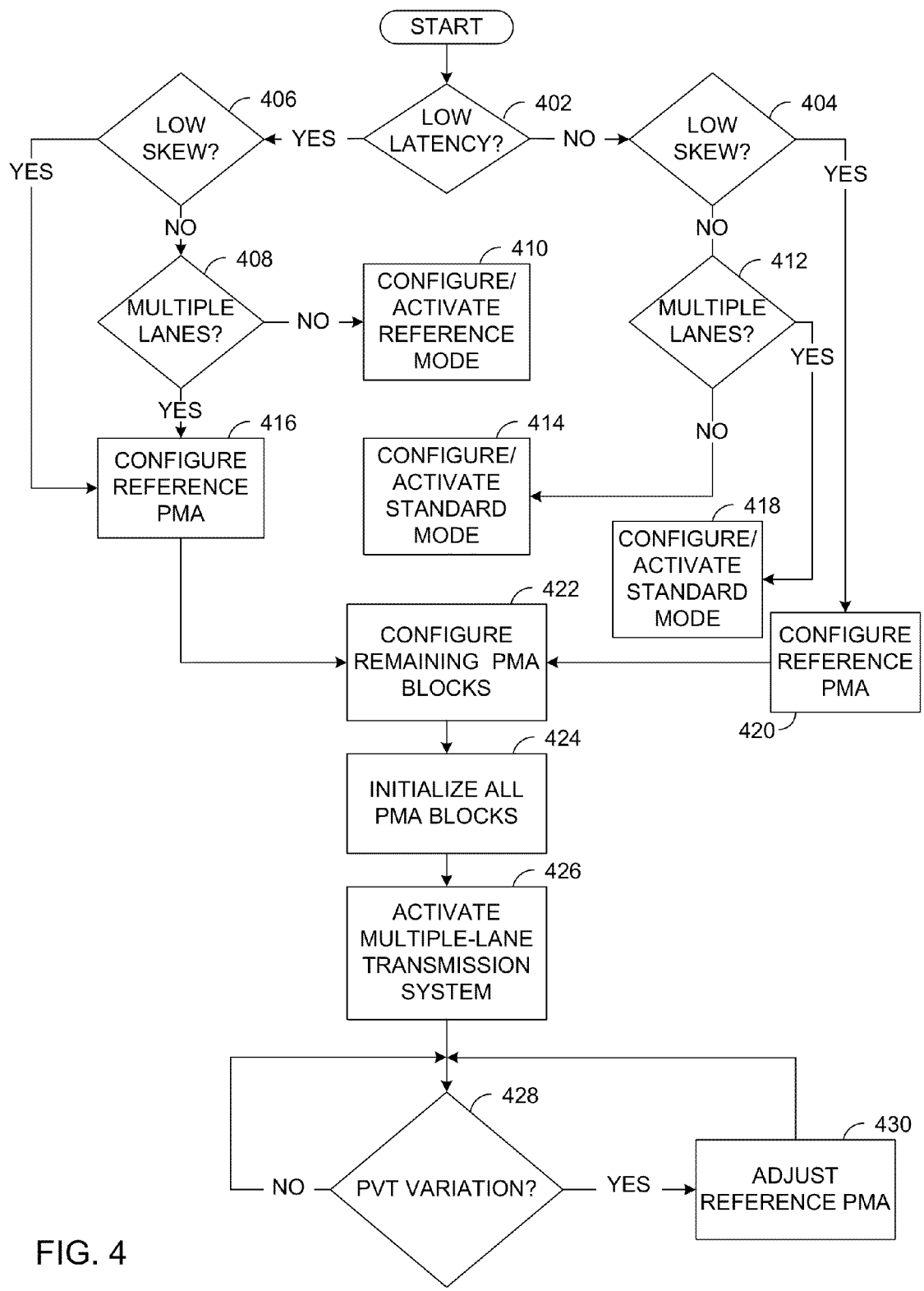
FIG. 4 illustrates a flow diagram of a method of providing one or more transmission lanes using a multiple-lane transmission architecture in accordance with one embodiment of the present invention.

Turning to FIG. 4, a flow diagram of a method of providing one or more transmission lanes using a multiple-lane transmission architecture in accordance with the various embodiments of the present invention is illustrated. The flow diagram of FIG. 4 implements the truth table as illustrated in Table 1.

TABLE 1

| MULTIPLE LANES? | SKEW REDUCTION? | LOW OR FIXED LATENCY? | SYSTEM CONFIGURATION |
|---|---|---|---|
| NO | NO | NO | STANDARD |
| NO | NO | YES | REFERENCE |
| YES | NO | NO | STANDARD |
| YES | NO | YES | REFERENCE & SLAVE |

TABLE 1-continued

| MULTIPLE LANES? | SKEW REDUCTION? | LOW OR FIXED LATENCY? | SYSTEM CONFIGURATION |
|---|---|---|---|
| YES | YES | NO | REFERENCE & SLAVE |
| YES | YES | YES | REFERENCE & SLAVE |

In steps 402-404, 412, 414, and 418, a standard system configuration may be identified, whereby low-latency and lane-lane skew are of no concern for a single or multiple-lane transmission system. As a result, FIFO 224 is not bypassed and the output of each transmission lane of a multiple-lane transmission system is not aligned to the output of any other transmission lane.

In such an instance, multiplexer 312 of FIG. 3 is configured by configuration module 126 of FIG. 1 to select a single output from VCO 306 as in steps 414 and 418. Steps 414 and 418 additionally configure multiplexer 324 to select the PISO CLOCK signal from divide-by-N 316. Since FIFO 224 is not bypassed, FIFO 224 absorbs the phase difference between signals PISO BLOCK and REFERENCE CLOCK, such that reliable data transfer between PCS 204 and PMA 202 is nevertheless ensured while the single-lane/multiple-lane transmission system is activated for operation as in steps 414 and 418.

For a low-latency, single-lane transmission mode, as determined in steps 402, and 406-408, multiplexer 312 is configured by configuration module 126 of FIG. 1 to select a single output from VCO 306 as in step 410. Multiplexer 324 is alternately configured to select the interpolated signal from divide-by-N 322 as in step 410. As a result, interpolator 310 interoperates with byte clock phase aligner 320 to cause signals PISO CLOCK and REFERENCE CLOCK to become phase aligned within the reference PMA for single-lane operation as in step 410.

As a result, process, temperature, or voltage (PVT) variation, or any other source of variation, that causes the delay magnitude exhibited by delay blocks 252-254 to change may be accommodated. Thus, signals PISO CLOCK and REFERENCE CLOCK remain phase coherent to ensure reliable data transfer between the PCS/PMA pair 204 and 202 of FIG. 2 even when PVT variation is present.

For a low-latency, multiple-lane transmission mode, as determined in steps 402, and 406-408, FIFO 224 is bypassed for each transmission channel of FIG. 2. A single PMA acts as a reference PMA to provide signal BYTE CLOCK to global clock tree 232. In such an instance, PMA clock generator 214 of the reference PMA is configured differently in step 416 as compared to the configuration of the remaining PMA clock generators 214 of the remaining PMAs as in step 422.

In the reference PMA, for example, multiplexer 312 is configured in step 416 by configuration module 126 of FIG. 1 to select a single output from VCO 306. Multiplexer 324 is alternately configured in step 416 to select the interpolated signal from divide-by-N 322. As a result, interpolator 310 interoperates with byte clock phase aligner 320 to cause signals PISO CLOCK and REFERENCE CLOCK to become phase aligned within the reference PMA as discussed above.

For the remaining PMAs 236 and 240, multiplexer 312 is instead configured in step 422 to select the interpolated output from interpolator 310 and the configuration of multiplexer 324 in step 422 is a don't care, since signal BYTE CLOCK from the remaining PMAs 236 and 240 is unused. It is noted that the configuration of the reference PMA as in step 420 is similar to step 416 when a low-latency configuration is not utilized, but when reduced or known skew across all lanes of a multiple-lane transmission system is nevertheless required. Configuration of the remaining PMAs in step 422 is also similar as discussed above.

Initialization of the low-latency, multiple-lane transmission mode begins in step 424 by activating byte clock phase aligner 320 of the reference PMA while the remaining byte clock phase aligners are deactivated. After an initialization period for reference PMA is complete, signal PISO CLOCK becomes phase aligned with signal REFERENCE CLOCK of the reference PMA so as to ensure reliable data transfer between the reference PCS/PMA pair as discussed above.

During the initialization periods for the remaining PMAs as in step 424, the respective byte clock phase aligners are activated, so that the respective PISO CLOCK signals may become phase aligned to their respective REFERENCE CLOCK signals. Once the initialization period for each PMA is complete, the transmission clocks across all transmission lanes are reasonably matched and activated for operation as in step 424.

The phase align blocks of all but the reference PMA are deactivated in step 426 because once the PISO CLOCK signals of each transmission lane are aligned, the PISO CLOCK signals tend to stay aligned. The phase aligner of the reference PMA remains active in step 426, however, so as to adjust the phase alignment of signal REFERENCE CLOCK with respect to the PISO CLOCK signals of all other PMAs as in steps 428-430 even if the magnitude of the delay provided by delay blocks 252-258 changes significantly due to PVT or other sources of variation as determined in step 428.

Other aspects and embodiments of the present invention will be apparent to those skilled in the art from consideration of the specification and practice of the invention disclosed herein. For example, PMA clock generators 214 may be implemented using a higher degree of symmetry, so as to minimize the delay differences between selecting the phase aligned signals, PISO CLOCK and REFERENCE CLOCK, as compared to their non-phase aligned counterparts. It is intended that the specification and illustrated embodiments be considered as examples only, with a true scope and spirit of the invention being indicated by the following claims.

What is claimed is:

1. A transmission system, comprising:
   a transmission lane configured to receive parallel data using a first clock signal and to serialize the parallel data using a second clock signal, wherein the transmission lane includes a clock generator that is configured to select between phase aligned and non-phase-aligned clock signals as the first and second clock signals, the clock generator including,
   a first multiplexer to programmably select between a phase aligned and a non-phase aligned bit clock signal as the first and second clock signals;
   a second multiplexer to programmably select between a phase aligned and a non-phase aligned byte clock signal as a clock signal exported from the clock generator;
   a first divider coupled to an output of the first multiplexer and configured to divide the second clock signal to generate the first clock signal; and
   a second divider coupled to a first input of the second multiplexer and configured to divide the phase aligned bit clock signal, wherein the second multiplexer selects between the divided phase aligned bit clock signal and the first clock signal as the exported clock signal; and
   a global clock tree coupled to receive the exported clock signal and configured to provide the exported clock signal to the clock generator as a reference clock signal; and a phase-locked loop coupled to the clock generator and configured to provide the non-phase aligned bit clock signal.

2. The transmission system of claim 1, wherein the clock generator further comprises a phase aligner coupled to receive the first clock signal and the reference clock signal and configured to provide a control signal to substantially align a phase of the first clock signal with a phase of the reference clock signal.

3. The transmission system of claim 2, wherein the clock generator further comprises an interpolator coupled to receive the control signal and coupled to receive the non-phase aligned bit clock signal and configured to minimize a phase error between the first clock signal and the reference clock signal in response to the control signal.

4. A method of establishing a single-lane transmission system, the method comprising:
- selecting, by a first multiplexer, a non-phase aligned bit clock signal to generate first and second clock signals, wherein the first clock signal is utilized to transfer parallel data into the transmission lane and the second clock signal is utilized to transfer serial data from the transmission lane;
- dividing a phase-aligned bit clock signal to generate a byte clock signal;
- exporting the byte clock signal from the transmission lane to a global clock tree;
- receiving the byte clock signal from the global clock tree as a reference clock signal; and
- adjusting a phase of the byte clock signal to substantially match a phase of the first clock signal to the reference clock signal, to establish data transfer through the transmission lane;
- wherein adjusting a phase of the byte clock signal comprises:
- comparing the phase of the first clock signal to a phase of the reference clock signal; and
- generating a control signal in response to the comparison;
- wherein exporting the byte clock signal comprises programmably controlling a second multiplexer to select the byte clock signal.

5. The method of claim 4, wherein selecting a non-phase aligned bit clock signal comprises programmably controlling the first multiplexer to provide a phase-locked loop output signal as the first and second clock signals.

6. The method of claim 4, wherein adjusting a phase of the byte clock signal further comprises:
- selecting a phase of the non-phase aligned bit clock signal in response to the control signal; and
- dividing the selected non-phase aligned bit clock signal to produce the byte clock signal.

7. The method of claim 6, wherein adjusting a phase of the byte clock signal further comprises minimizing a phase difference between the first clock signal and the reference clock signal.

* * * * *